United States Patent [19]
>
> Coussot

[11] 4,344,051

[45] Aug. 10, 1982

[54] ELASTIC SURFACE WAVE TRANSDUCER AND FILTER INCORPORATING SUCH A TRANSDUCER

[75] Inventor: Gerard Coussot, Paris, France

[73] Assignee: Thomson-CSF, Paris, France

[21] Appl. No.: 115,095

[22] Filed: Jan. 24, 1980

[30] Foreign Application Priority Data

Jan. 26, 1979 [FR] France .............................. 79 02100

[51] Int. Cl.³ ...................... H03H 9/145; H03H 9/64
[52] U.S. Cl. ................................... 333/194; 333/154; 333/196
[58] Field of Search ................................ 333/150–155, 333/193–196; 310/313, 313 R, 313 A, 313 B, 313 C, 313 D; 330/5.5; 331/107 A

[56] References Cited

U.S. PATENT DOCUMENTS 4,144,508 3/1979 Lewis et al. ..................... 333/194 X
4,203,082 5/1980 Tsukamoto et al. ............ 333/196 X

*Primary Examiner*—Marvin L. Nussbaum
*Attorney, Agent, or Firm*—Oblon, Fisher, Spivak, McClelland & Maier

[57] ABSTRACT

In order to bring about a reduction in the reflection coefficient due to reflections on the successive fingers of a transducer in the form of interdigitated transducer elements with split fingers of unequal length when a load impedance is applied at the terminals thereof, the invention provides for the displacement of at least the smallest minor lobe of the pulse response envelope, whose design is reproduced by the fingers, in order to position it in front of one of the maxima of the major lobe.

4 Claims, 6 Drawing Figures

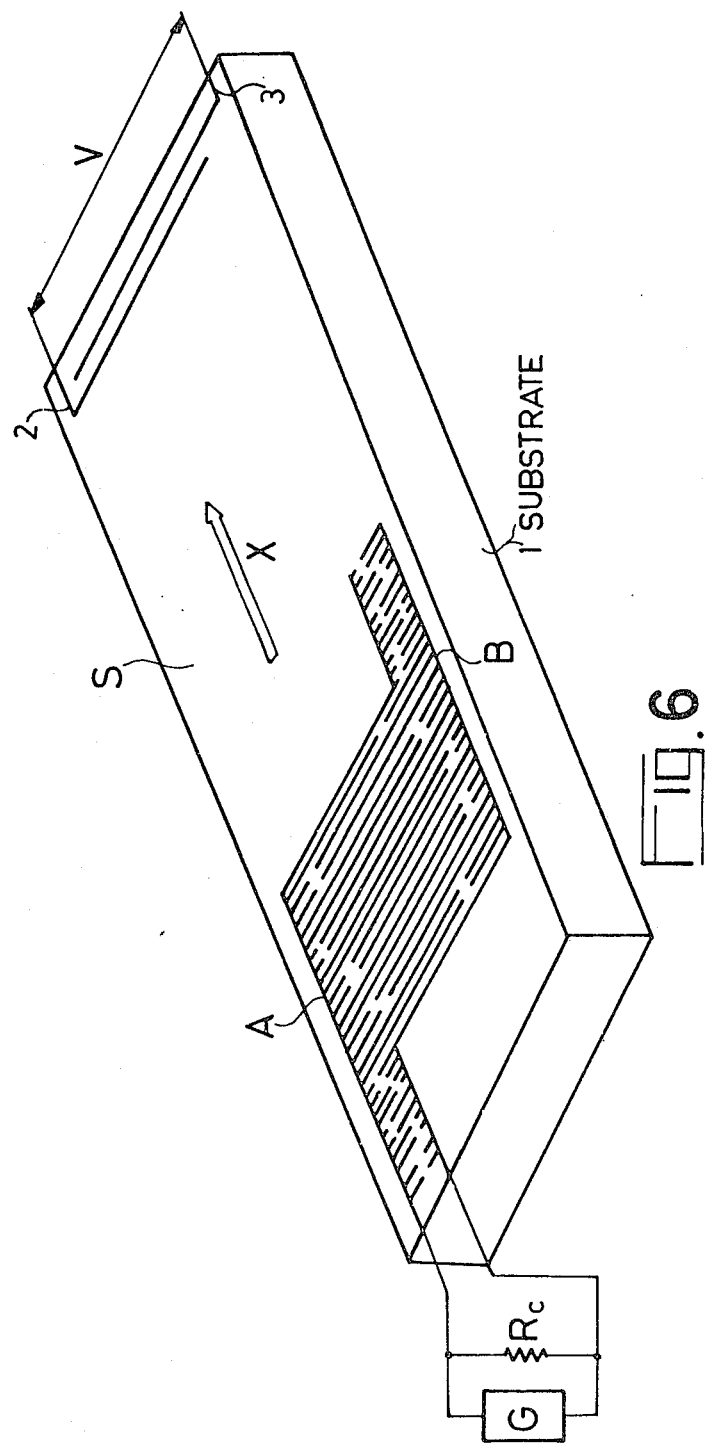

ELASTIC SURFACE WAVE TRANSDUCER AND FILTER INCORPORATING SUCH A TRANSDUCER

BACKGROUND OF THE INVENTION

The present invention relates to elastic surface wave transducers.

The elastic surface wave devices generally have two sets of electrodes in the form of interdigitated transducers deposited on the surface of a piezoelectric substrate. An electrical voltage which is to be processed (for example filter or delay) is applied to one of the sets, which is called the transmission transducer in order to bring about the transmission of elastic surface waves in the direction of the other set, which is called the reception transducer and which supplies a voltage, whose characteristics are dependent on the vibratory mode transmitted and the configuration of the transducer elements.

One of the important characteristics of an elastic surface wave device is its frequency response, which is the product of the responses of the two transducers. It is known that the envelope of the pulse response of a transducer is reproduced in the design formed by the ends of the fingers of at least one of the electrodes of the transducer. Thus, for example, a band pass filter is obtained when one of the two transducers has fingers of unequal length describing a curve representing the sin X/X function and at least its central lobe and its minor main lobes. The central frequency is defined by the spacing between two successive fingers of the same transducer and the band width is linked with the transducer length. The transfer function of the filter is however linked with other parameters which introduce parasitic effects with respect to which it is difficult to take action. One of these effects is constituted by the reflections of surface waves on successive fingers. These reflections introduce transmission losses, which can vary as a function of the frequency leading to deformations in the pass band. It is known to neutralise the waves retransmitted at each finger in this way by using split-finger transducers in such a way that the successive reflected waves are in phase opposition and therefore cancel one another out, instead of being added to one another as is the case with solid fingers. However, this neutralisation does not prevent transmission losses if the reflection coefficient is high. It has been experimentally found that the reflection coefficient depends to a significant extent on the load impedance of the two transducers. For example, in the case of a transmission transducer, this impedance is constituted by the internal impedance of the circuit to which the particular surface wave device is connected. According to experimental results, when this load impedance is low, the reflection coefficient is low for split-finger transducers, but high for solid finger transducers. However, when the load impedance is high the reflection coefficient is high with split finger transducers.

BRIEF SUMMARY OF THE INVENTION

The invention relates to a transducer making it possible to obtain the selected transfer characteristic with split finger transducer elements in order to prevent the retransmission of parasitic waves, but such that the reflection coefficient is low, even when the electrodes are connected by a high impedance.

The invention is applicable to transducers, whose pulse response has minor lobes. Thus, this response is typically formed by a large major lobe and minor lobes which are symmetrical with respect to the major lobe. Conventionally, the longitudinal axis of the minor lobes is that of the major lobe. A wave transmitted from the first minor lobes to the major lobe alternately encounters the fingers of the two transducers between which the load impedance is present. The invention comprises staggering the minor lobes, or only the smallest existing minor lobe in such a way that its axis no longer coincides with the axis of the major lobe, but to the maximum extent faces said major lobe, thus, the wave transmitted from the said minor lobe largely encounters fingers belonging to the same transducer and few fingers belonging to the other transducer. The fingers of the same transducer are under short-circuit conditions, so that the reflection coefficient on these fingers is very low. In this way, the overall reflection coefficient is reduces and this applies to an even greater extent when the disks of the major lobe on either side of the maximum are more rigid.

BRIEF DESCRIPTION OF THE DRAWINGS

The invention is described in greater detail hereinafter relative to non-limitative embodiments and the attached drawings, wherein show:

FIG. 6 an application of the invention to a filter.

DETAILED DESCRIPTION OF THE PREFERRED EMBODIMENTS

Figure 1:
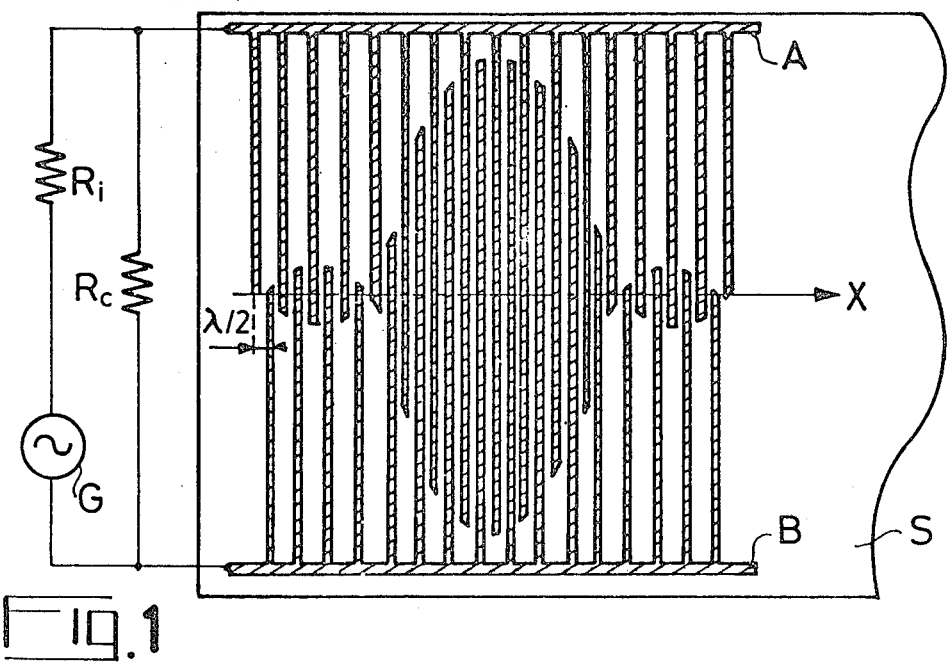
FIG. 1 a known surface wave transducer.

FIG. 1 shows a known surface wave transducer comprising two transducer elements A and B formed by metal deposits on the surface S of a piezoelectric substrate forming part of an elastic surface wave device. The transducer elements A and B have interdigitated fingers. The lengths of these fingers are unequal and form two sin x/x curves in such a way that the pulse response of the transducer has the form sin x/x. In actual fact, only the major lobe and one or more minor lobes are shown in the drawing of the transducer. The frequency response of such a transducer is that of a band pass filter, whose centre frequency is determined by the spacing between two successive fingers of the same transducer, said spacing being equal to $\lambda/2$ in which $\lambda$ is the wavelength in the centre of the band. The band width is dependent on the transducer length. Disadvantages result from reflections of surface waves on successive fingers. Thus, waves transmitted from finger to finger are reflected by said fingers and the waves reflected by two successive fingers are in phase due to the spacing of the fingers and are added to one another.

Figure 2:
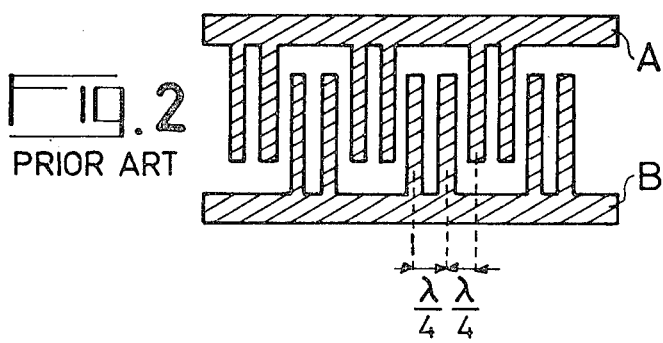
FIG. 2 a known split finger transducer.

An already known improvement for obviating these disadvantages is shown in FIG. 2 in the case of a transducer with fingers of equal length. This improvement is due to the fact that the fingers are split into two metallic strips which are hatched in the drawing. The distance between two strips is equal to $\lambda/4$, no matter whether they belong to the same or to different transducer elements. The waves reflected by two successive strips are thus in phase opposition and cancel one another out. This prevents the transmission of parasitic waves at the same time as the main wave. However, this does not prevent the reflection phenomenon, which introduces an attenuation of the wave obtained at the transducer output, said attenuation being variable with the frequency, which creates distortions of the pass bands. Thus, the reflection coefficient is dependent on the impedance between the two transducer elements A and B. The transducer shown in FIG. 1 is a transmission transducer and is connected to an input circuit, whose equivalent diagram can be a generator G supplying an alternating voltage and having an internal series impedance $R_i$ in parallel with a load impedance $R_c$, whereby impedance $R_c$ can for reasons of simplification, be likened to a resistor.

Figure 3:
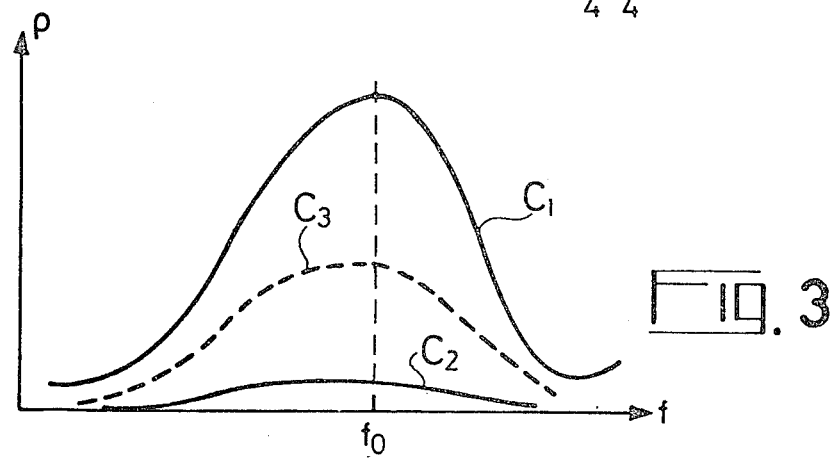
FIG. 3 three curves showing the reflection coefficient.

FIG. 3 shows variations in the reflection coefficient $\rho$ on a finger of an elastic wave coming from the upstream finger, as a function of the frequency f of said wave for different cases. Curve $C_1$ corresponds to split fingers between which there is an infinite load. It has experimentally been found that the reflection coefficient is high, particularly round the centre frequency $f_o$ of the transducer band. Curve $C_2$ corresponds to split fingers between which there is a zero load, which is the case for example when the two successive fingers considered belong to the same transducer element. It can be seen that the reflection coefficient is very low. Curve $C_3$ corresponds to an intermediate case where the two fingers in question belong to two different transducers connected by a high impedance. This case more particularly occurs when the transducer is the input transducer of a surface wave device connected to the collector circuit of a bipolar transistor or to the drain circuit of a field effect transistor or in the case of an output transducer connected to the grid of a field effect transistor. FIG. 1 shows a wave, whose transmission direction X is in accordance with the axis of the pulse response loads. Thus, the wave comes from a minor lobe in the direction of the major lobe and successively encounters fingers belonging to different transducers and consequently between which the impedance $R_c$ is present.

Figure 4:
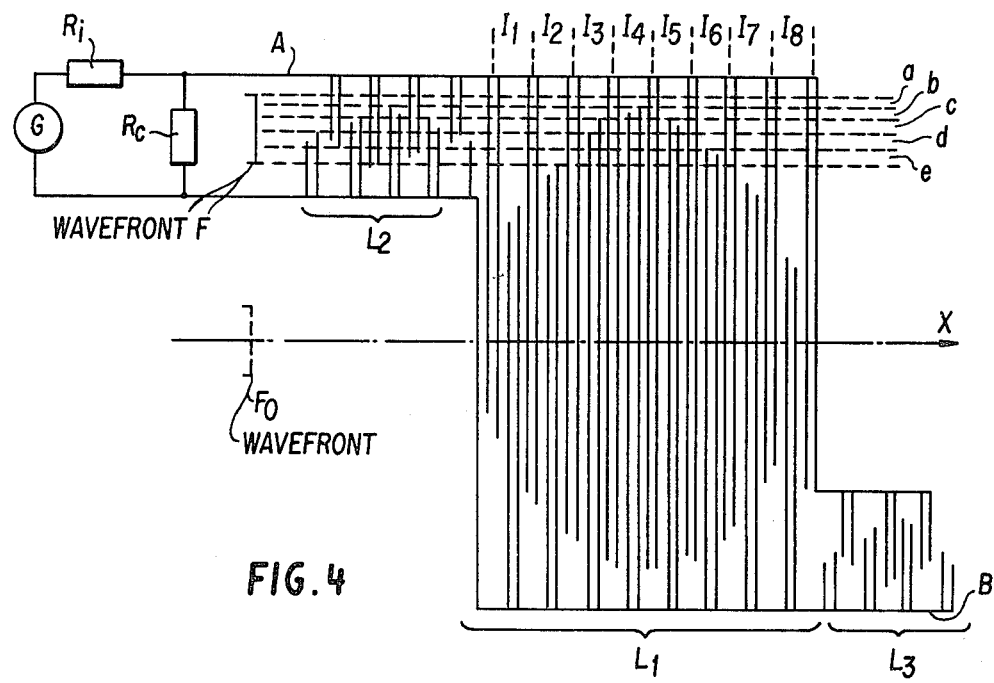
FIG. 4 a surface wave transducer according to the invention.

FIG. 4 shows a novel configuration of the transducer having the same frequency response as that of FIG. 1 and split fingers like that of FIG. 2. In this configuration, on either side of the major lobe $L_1$ there are two minor lobes $L_2$ and $L_3$, whose axes are displaced relative to the axis of the major lobe. Thus, line lobe $L_2$ faces one of the maxima of lobe $L_1$. Lobe $L_3$ faces the other maximum of lobe $L_1$. Thus, the wave front F, diagrammatically illustrated in the drawing and which is transmitted by lobe $L_2$ on reaching lobe $L_1$ essentially encounters fingers belonging to the same transducer A, said fingers therefore being in shortcircuit. In the same way, the way from the major lobe $L_1$ reaching lobe $L_3$ comes from a zone where the fingers all belong to the same transducer B. In order to diagrammatically explain this phenomenon, it is possible to divide up the zone of the large lobe where the front F arrives into radiating intervals $I_1$, $I_2$–$I_8$ succeeding one another in this order in the transmission direction X and into elementary channels parallel to X, i.e. a, b, c, d, e. In channel a, all the fingers belong to the same transducer A, whilst in channel b there is a single radiating channel $I_4$. In channels c and d, there are three radiating intervals $I_3$, $I_4$, $I_5$ and in channel e four radiating intervals $I_3$, $I_4$, $I_5$ and $I_6$. For each channel, the radiating intervals can be likened to ultrasonic sources of variable amplitude which are delayed with respect to one another and whose contributions are added to one another. If the minor lobe $L_2$ had been positioned as in FIG. 1, the wave front reaching lobe $L_1$ would have had the configuration $F_o$ shown by dotted lines and would only have encountered radiating intervals, i.e. fingers belonging successively to two transducers A and B with the load $R_c$ between them. As the intervals $I_1$ to $I_8$ are positioned elastically in cascade, the successive reflections are added to one another, so that the configuration according to the invention makes it possible to reduce the overall reflection coefficient. Lobe $L_3$ is positioned symmetrically to lobe $L_2$ with respect to the centre of lobe $L_1$. This positioning is not critical and can be varied.

Figure 5:
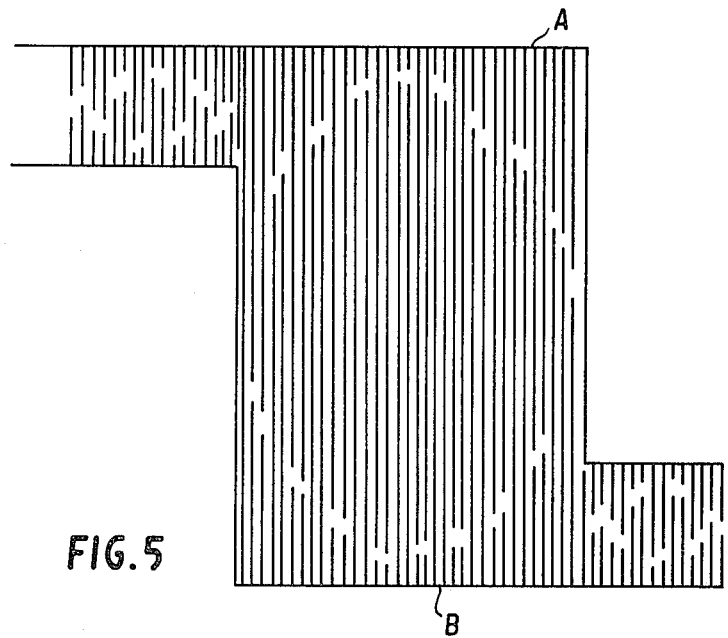
FIG. 5 a variant of the transducer according to the invention.

FIG. 5 shows a constructional variant according to the invention using a known process for obviating distortions of the wave front resulting from differences in the lengths of the fingers. For this purpose, each transducer is formed by an alternation of so-called active fingers and so-called dummy fingers. Only pairs of active fingers form radiating elements. The dummy fingers face the active fingers only leaving a small gap. These gaps describe a curve corresponding to the envelope of the pulse response of the transducer.

FIG. 6 shows an application of the invention to an elastic surface wave filter. Such a filter comprises a piezoelectric substrate 1, on one of the faces S of which are deposited an input transducer formed by two transducer elements A and B according to the invention, i.e. as shown for example in FIG. 4 or 5, and an output transducer formed by two transducer elements 2 and 3, for example having a single finger. A generator G in parallel with a load impedance $R_c$, which can be likened to a power supply are connected between the two transducer elements A and B. A voltage B is collected between the two transducer elements 2 and 3 and this corresponds to the voltage supplied by the generator G filtered in accordance with the characteristics of the transmission transducer. The invention does not apply only to filters, but to all devices with elastic surface waves transmitted between two transducers on the surface of a piezoelectric substrate, particularly those having a transducer with fingers of unequal length, whose pulse response has minor lobes.

What is claimed is:

1. An elastic surface wave transducer with a pulse response having at least one major lobe and one minor lobe positioned upstream of the major lobe, said transducer having two interdigitated transducer elements with fingers of unequal length in such a way as to form a succession of radiating intervals transmitted by surface waves in a direction X according to a design reproducing the envelope of the said pulse response, each finger being formed by two parallel metal strips spaced by $\lambda/4$, $\lambda$ being the wavelength corresponding to the central frequency of the transmission spectrum of the transducer, whereby the zone of interdigitated transducer elements which synthesize the minor lobe and the zone of the interdigitated transducer elements which synthesize the major lobe are displaced perpendicular to the transmission direction in such a way that the waves transmitted by the minor lobe essentially encounter fingers belonging to the same transducer element in the region of the major lobe.

2. A transducer according to claim 1, wherein each transducer element alternately has so-called active fingers and so-called dummy fingers, only the active fingers of the transducer elements overlapping to form radiating elements.

3. A transducer according to claim 1, wherein the transducer is a transmission transducer transforming electrical energy into elastic energy.

4. An elastic surface wave filter comprising a piezoelectric substrate having a surface, a transducer transmitting elastic surface waves placed on the said surface, the transmission transducer having a pulse response with at least one major lobe and a minor lobe positioned upstream of the major lobe, said transmission transducer having two interdigitated transducer elements with fingers of unequal length in such a way as to form a successive of radiating intervals transmitting the surface waves in a direction X, in accordance with a design reproducing the envelope of the pulse response, each finger being formed by two parallel metal strips spaced by $\lambda/4$, $\lambda$ being the wavelength corresponding to the central frequency of the transmission spectrum of the transducer, the zone synthesizing the minor lobe and the zone synthesizing the major lobe being displaced perpendicular to the transmission direction in such a way that the waves transmitted by the minor lobe essentially encounter fingers belonging to the same transducer element in the region of the major lobe and a transducer for receiving elastic surface waves placed on the said surface in such a way as to receive the waves transmitted by the surface transducer in order to convert them into electrical signals.

* * * * *